(12) United States Patent
Lin

(10) Patent No.: US 8,050,901 B2
(45) Date of Patent: Nov. 1, 2011

(54) PREDICTION AND CONTROL OF NBTI OF INTEGRATED CIRCUITS

(75) Inventor: Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 937 days.

(21) Appl. No.: 11/800,623

(22) Filed: May 7, 2007

(65) Prior Publication Data

US 2008/0071511 A1 Mar. 20, 2008

Related U.S. Application Data

(60) Provisional application No. 60/844,569, filed on Sep. 14, 2006.

(51) Int. Cl.
*G06F 17/50* (2006.01)

(52) U.S. Cl. .......................................... 703/14; 716/100

(58) Field of Classification Search .................... 703/13, 703/14; 716/1, 2, 4, 19, 100, 101, 106, 136
See application file for complete search history.

(56) References Cited

U.S. PATENT DOCUMENTS

| | | | |
|---|---|---|---|
| 6,775,584 B1 | 8/2004 | Huang et al. | |
| 6,799,909 B2 | 10/2004 | Liu et al. | |
| 6,944,584 B1 | 9/2005 | Tenney et al. | |
| 7,000,202 B1 | 2/2006 | Srinivasan et al. | |
| 7,243,320 B2 * | 7/2007 | Chiu et al. | 716/4 |
| 7,482,798 B2 * | 1/2009 | Han | 323/316 |
| 2002/0072872 A1 * | 6/2002 | Chatterjee et al. | 702/117 |
| 2010/0102842 A1 * | 4/2010 | Suzuki | 324/763 |

FOREIGN PATENT DOCUMENTS

JP 11-110191 A 4/1999

OTHER PUBLICATIONS

Chen et al. (Dynamic NBTI of p-MOS transistors and its impact on MOSFET scaling, IEEE 2002).*
Lin, J.C., et al., "Prediction and Control of NBTI—Induced SRAM $V_{ccmin}$ Drift," 2006, IEEE, 4 pp.

* cited by examiner

*Primary Examiner* — Paul Rodriguez
*Assistant Examiner* — Andre Pierre Louis
(74) *Attorney, Agent, or Firm* — Slater & Matsil L.L.P.

(57) ABSTRACT

A modeling system for modeling integrated circuits includes a process variation generator for generating a first statistic distribution of a process parameter; a performance parameter distribution generator for generating a second distribution of a performance parameter; a stress generator for generating a third statistic distribution of the performance parameter under a stress condition; and a circuit simulator for receiving data randomly generated based on the first, the second and the third distributions and for generating a statistic distribution of a target performance parameter.

19 Claims, 9 Drawing Sheets

PREDICTION AND CONTROL OF NBTI OF INTEGRATED CIRCUITS

This application claims benefit of the following provisionally filed U.S. patent application: Patent Application Ser. No. 60/844,569, filed Sep. 14, 2006, entitled "Prediction and Control of NBTI," which patent application is incorporated herein by reference.

TECHNICAL FIELD

This invention relates generally to integrated circuits, and more particularly to the modeling of integrated circuits, and even more particularly to the prediction of the behavior of integrated circuits under negative-bias thermal instability stress.

BACKGROUND

Reliability-related issues of integrated circuits have existed for decades. In the past, negative-bias thermal instability (NBTI) related issues have not had a significant impact on designs due to the relatively large size of integrated circuits. With the scaling of integrated circuits, however, the NBTI related issues become increasingly important. For designs using 0.13 micron technologies or below, NBTI reliability analyses need to be taken into consideration of circuit design in order to maximize circuit performance, particularly for circuits demanding high reliability and/or performance. Identifying reliability-related performance problems in early design stages means faster and more reliable end products with significantly reduced chip re-spins, wasted silicon, and potentially millions of dollars.

One example of NBTI related issues is the degradation of Vccmin of static random access memory (SRAM) cells under NBTI stresses, such as high voltage and/or high temperature. Vccmin is the higher of the minimum voltages required to read data from, and write data to, SRAM memory cells. Because Vccmin affects both the performance and reliability of SRAM cells, and because the Vccmin drifts under NBTI influence, the prediction of the Vccmin's behavior under NBTI stress becomes very important for the design of SRAM memory.

Existing modeling and simulation methods do not provide means for designers to predict the behavior of integrated circuits under NBTI influence. For example, in SPICE simulation for determining the Vccmin of an SRAM cell, circuit parameters of the SRAM cell are first inputted into the SPICE, and then static noise margins (SNM) and write margins (WM) for the nodes of the SRAM cell are determined by SPICE. Read Vccmin and write Vccmin are then calculated accordingly. The Vccmin of the SRAM cell is the greater of the read Vccmin and write Vccmin.

The conventional methods only provide one Vccmin value for each simulated SRAM cell. The behavior of SRAM array, which includes multiple SRAM cells, can't be provided. In addition, the SPICE simulation does not provide the behavior of the SRAM(s) under NBTI stress, and thus designers lack the means for predicting the behavior of the memory array in order to optimize design.

Therefore, a solution is needed for designers to identify possible problems such that the designer can design to accommodate around these situations, such as Vccmin drift or voltage overshoot, for which the designers may compensate for without sacrificing performance of integrated circuits.

SUMMARY OF THE INVENTION

In accordance with one aspect of the present invention, a method of modeling integrated circuits includes providing a circuit simulator; generating a set of circuit parameters of a circuit using a random mean, wherein the random mean reflects a statistic distribution of measured circuit parameters; and generating a target performance parameter of the circuit by assigning the set of circuit parameters into the circuit simulator.

In accordance with another aspect of the present invention, a method of modeling performance of integrated circuits includes providing a circuit simulator; providing a process variation generator generating a first statistic distribution of a process parameter of a circuit; providing a performance parameter distribution generator generating a second statistic distribution of a performance parameter of the circuit; generating a plurality of sets of circuit parameters from the first and the second statistic distributions; and generating a distribution of a target performance parameter of the circuit by generating a target performance value from each of the sets of circuit parameters.

In accordance with yet another aspect of the present invention, a method of optimizing Vccmin performance of SRAM design includes providing a circuit simulator; providing a process variation generator generating a first statistical distribution of process parameters of a SRAM cell-comprising circuit by a stochastic technique; providing a performance parameter distribution generator generating a second statistic distribution of a performance parameter of the SRAM cell-comprising circuit by the stochastic technique; and generating a pre-stress distribution of read Vccmins and write Vccmins of the SRAM cell-comprising circuit using the first and the second statistic distributions.

In accordance with yet another aspect of the present invention, a modeling system for modeling integrated circuits includes a process variation generator for generating a statistic distribution of a process parameter; and a circuit simulator for receiving circuit parameters extracted the statistic distribution of the process parameter to generate a statistic distribution of a target performance parameter.

In accordance with yet another aspect of the present invention, a modeling system for modeling integrated circuits includes a process variation generator for generating a first statistic distribution of a process parameter; a performance parameter distribution generator for generating a second statistic distribution of a performance parameter; a stress generator for generating a third statistic distribution of the performance parameter under a stress condition; and a circuit simulator for receiving data randomly generated based on the first, the second and the third distributions and for generating a statistic distribution of a target performance parameter.

Being able to determine the pre-stress and after stress distribution of target performance parameters, the embodiments of the present invention provide a means for optimizing circuit design.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
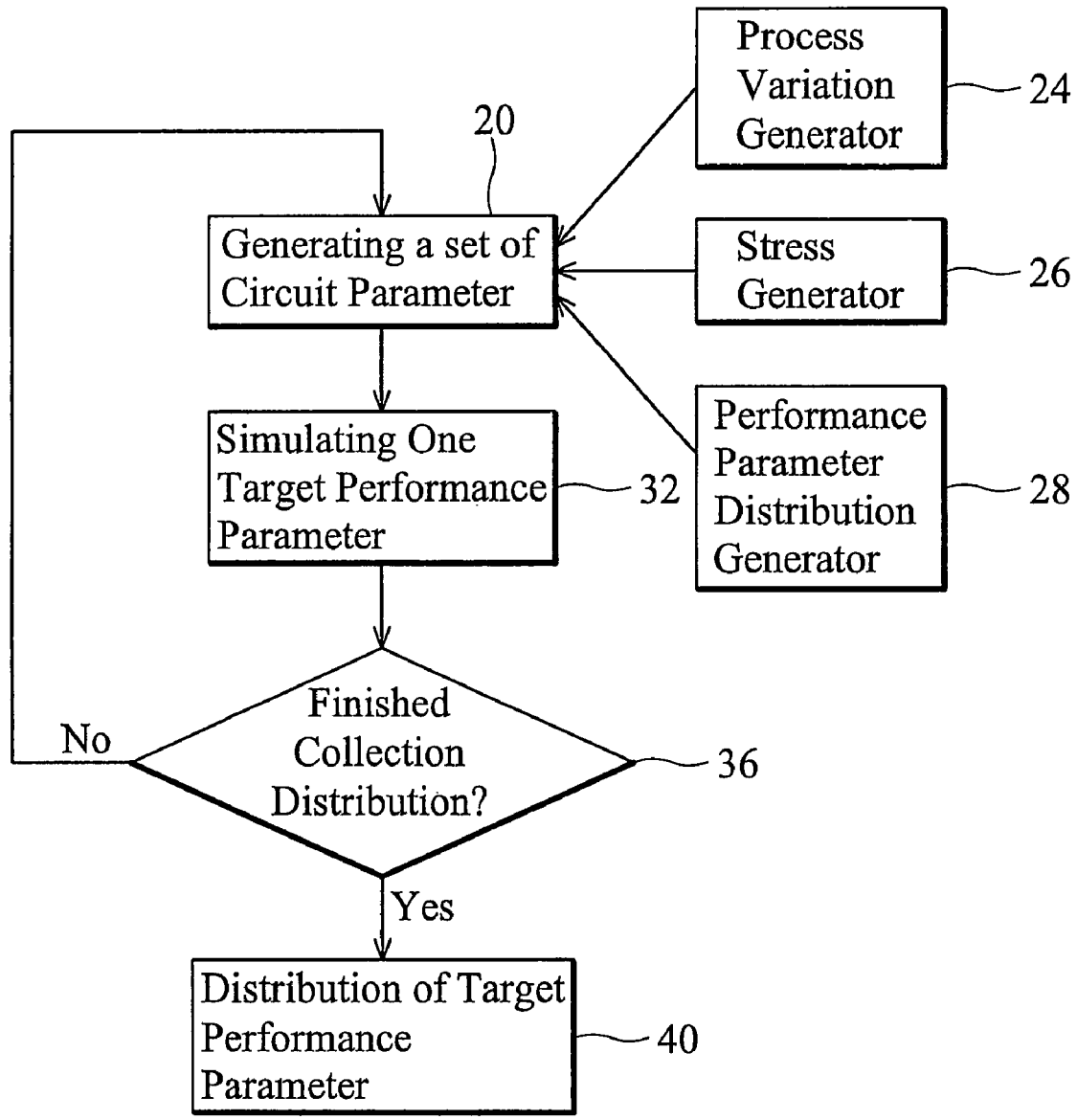
FIG. 1 illustrates a flow chart of embodiments of the present invention.

FIG. 1 illustrates a flow chart of an embodiment of the present invention, which is performed by a modeling system. The modeling system of the present invention includes a process variation generator 24, a stress generator 26, a performance parameter distribution generator 28, and a simulator. In an initial step (step 20) of the modeling process, a set of circuit parameters, which represent a circuit to be simulated, is generated, wherein the circuit parameters include process parameters and some performance parameters. The generation of the circuit parameters is performed by process variation generator 24, stress generator 26 and performance parameter distribution generator 28, wherein the functions of each of these generators are discussed in detail in subsequent paragraphs.

The generated set of circuit parameters is input into a simulator (such as SPICE simulator) to generate a desired user-specified performance parameter (step 32). Throughout the description, the user-specified performance parameter is referred to as a target performance parameter. Steps 20 and 32 are then repeated (step 36) by generating a plurality of sets of circuit parameters, which have fluctuations from one set of circuit parameters to another. For each set of the circuit parameters, one value of the target performance parameter is obtained (step 32). For plurality of sets of circuit parameters, the distribution of the performance parameter is obtained (step 40). If the generation of the set of circuit parameters takes no value from the stress generator, the resulting distribution is a pre-stress distribution. To obtain a post-stress distribution of the target performance parameter, the stress generator 26 is also involved in the generation of circuit parameters in addition to the process variation generator 24 and the performance parameter distribution generator 28. Therefore, both pre-stress and post-stress distributions of the target performance parameter are obtained.

In subsequent paragraphs, the process steps illustrated in FIG. 1 are discussed in detail. For an easier understanding of the concept of the present invention, a static random access memory (SRAM) cell is used as an example. The exemplary target performance parameters are read Vccmin, which is the minimum Vcc required for correctly reading from the SRAM cell, write Vccmin, which is the minimum Vcc required for correctly writing to the SRAM cell, and corresponding Vccmin, which is the greater of the read Vccmin and the write Vccmin. It is appreciated, however, that the modeling methods and modeling system of the present invention can be used on any other circuits.

The process variation generator 24 simulates a set of process parameters, which reflects the process variations including both intra-die variation and inter-die variation. The exemplary process parameters include geometry data (or physical data) of the circuit such as gate lengths of transistors, gate widths, and the like. In an exemplary embodiment, to accurately reflect the process variations in practical manufacturing processes of integrated circuits, the process variations on real wafers are collected. Data such as fluctuation range and distribution of the process parameters are then determined. For example, if the desired gate length of transistors is 65 nm, the actual gate length of a specified set of transistors on a wafer(s) are measured after the fabrication of the wafer(s) to determine the process variation. The measured data are then input into the process variation generator 24. At the time the set of circuit parameters is compiled (step 20), a random value for each process parameter is generated using a stochastic technique (such as Monte-Carlo method). However, the multiple values for one process parameter generated by the process variation generator 24 will reflect the statistic distribution of the process parameter collected from wafers. For example, for the gate length, a generated gate length is a value fluctuating around 65 nm.

Figure 2:
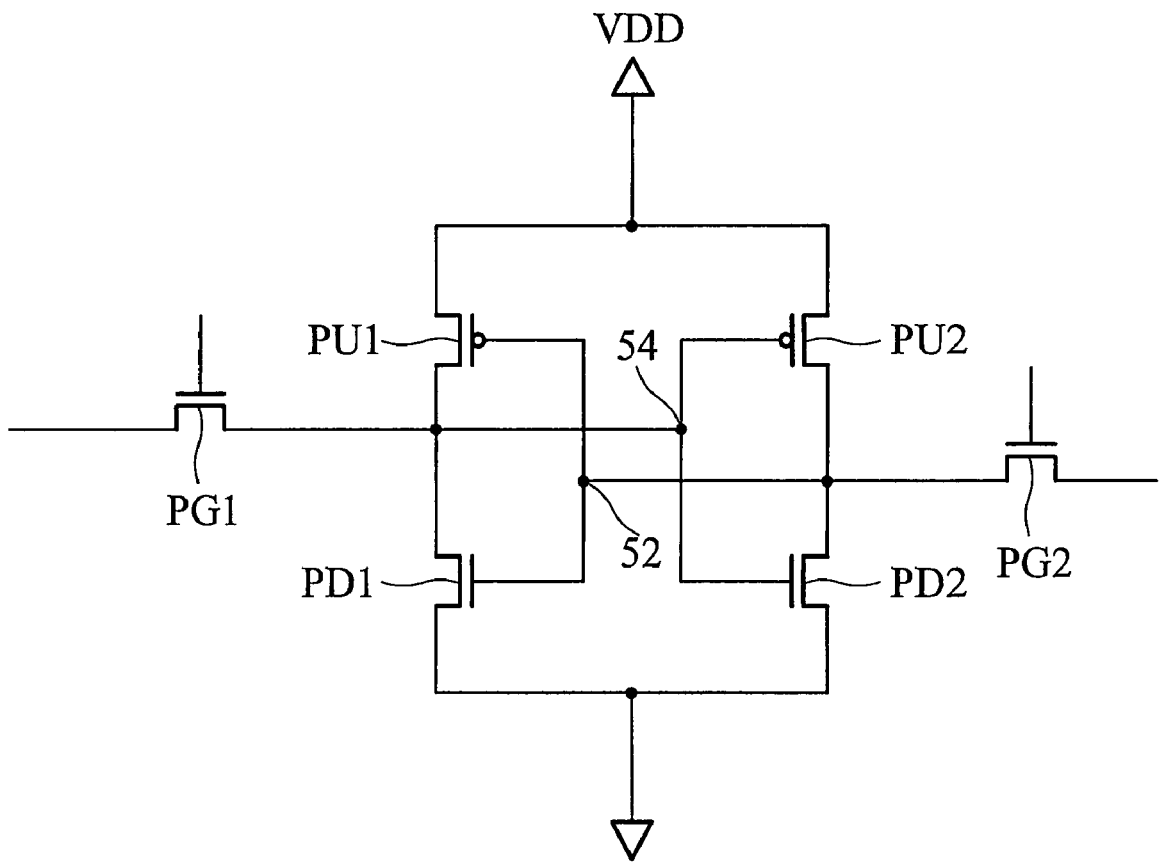
FIG. 2 illustrates an exemplary circuit diagram of a six-transistor static random access memory (SRAM) cell.

Referring to FIG. 2, using six-transistor (6T) SRAM cell as an example, wherein the 6T SRAM cell includes pull-up transistors PU1 and PU2, pull-down transistors PD1 and PD2, and pass-gate transistors PG1 and PG2, the gate length of each of the transistors can be expressed as:

$$L = \text{target\_}L + \text{delta\_}L \quad [\text{Eq. 1}]$$

wherein for each of the transistors PU1, PU2, PD1, PD2, PG1 and PG2, target_L is the designed length (or target length) of the corresponding transistor, delta_L is the randomly generated variation in length, and length L is the process parameter that is input into the simulator as a circuit parameter. It is expected that the generated gate length L will fluctuate around the target gate length target_L.

The performance parameter distribution generator 28 (refer to FIG. 1) has similar functions as the process variation generator 24, except it generates performance-related parameters such as threshold voltage Vt, saturation current Idsat, and the like (instead of process parameters). Again, the randomly generated performance parameters should also reflect the data on real circuits, and the corresponding distribution may be obtained by measuring real wafers and chips. In an exemplary embodiment for generating threshold voltage Vt, the generated threshold voltage Vt of each of the transistors can be expressed as:

$$Vt = \text{target\_}Vt + \text{delta\_}Vt \quad [\text{Eq. 1}]$$

wherein target_Vt is the target threshold voltage of the corresponding transistor, and delta_Vt is a randomly generated variation according to the measured distribution. It is expected that the generated threshold voltage Vt will fluctuate around the target threshold voltage target_Vt.

From above discussions, it is noted that the plurality sets of generated circuit parameters reflects the variation in real circuits. Therefore, the distribution of plurality of values of simulated target performance parameters, each being simulated based on one set of circuit parameters, will reflect the distribution of the target performance parameter in real circuits. Furthermore, if Vccmin is selected as the target performance parameter, the generated distribution of Vccmin will reflect the distribution of SRAM array, which includes plurality of SRAM cells.

Figure 3:
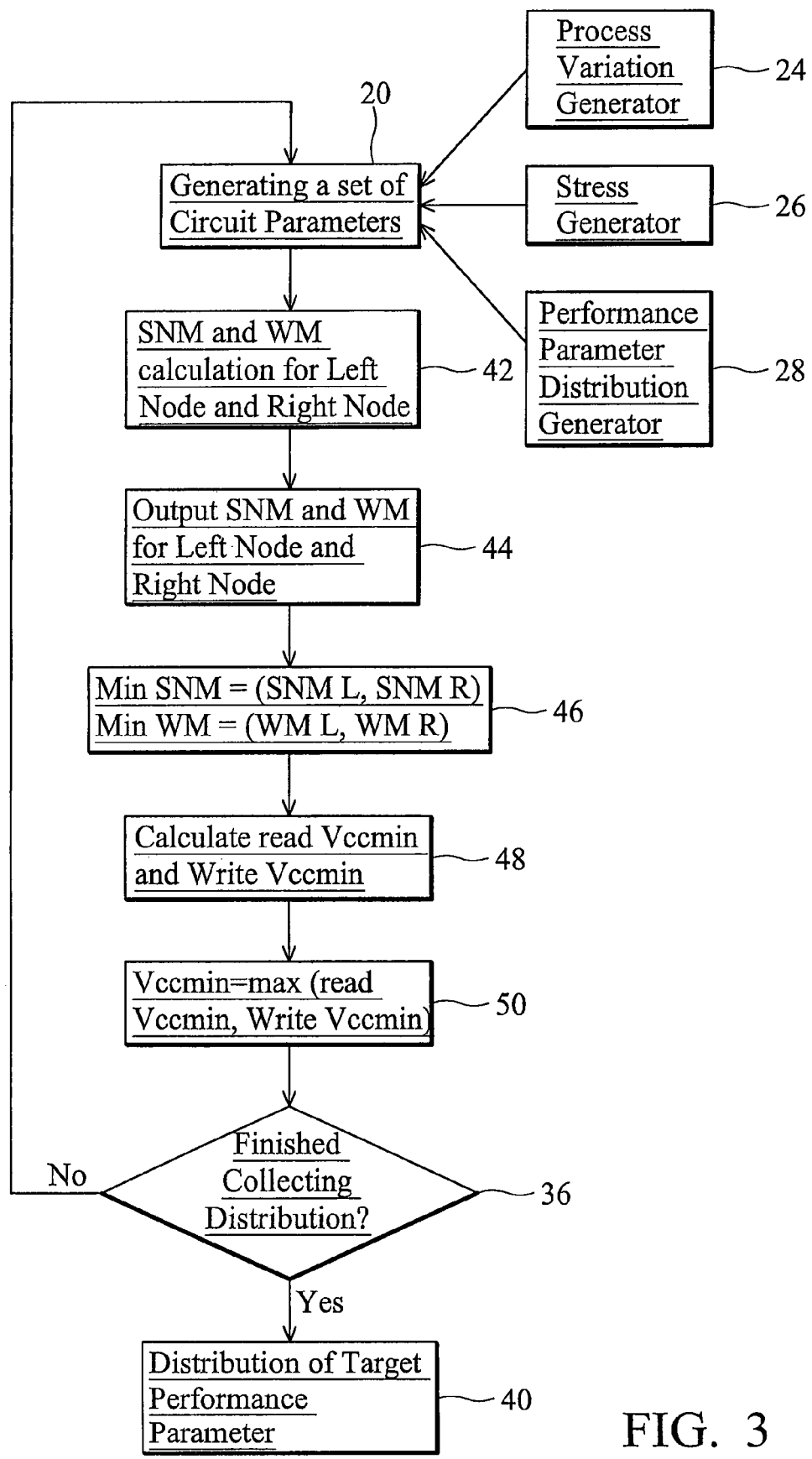
FIG. 3 illustrates a flow chart of an exemplary embodiment of the present invention, wherein a distribution of Vccmins of multiple SRAM cells is determined.

When the process steps illustrated in FIG. 1 are preformed for the modeling of SRAM cells, the corresponding flow chart may be replaced by the flow chart shown in FIG. 3. The step of simulating one performance parameter (step 32) is replaced by the steps for determining a read margin (RM) and a write margin (WM). In step 42, static noise margins (SNM) and WMs for two storage nodes 52 and 54 (FIG. 2, referred to left node and right node hereinafter, respectively) are calculated (step 42) and output (step 44). The minimum SNM is then determined, as the smaller one of the left node SNM (SNM_L) and right node SNM (SNM_R), and the minimum WM is determined as the smaller one of the left node WM (WM_L) and right node WM (WM_R, step 46). The maximum read Vccmin and the maximum write Vccmin are then determined (step 48). The Vccmin of the SRAM cell is the greater of the maximum read Vccmin and the maximum write Vccmin. It is noted that steps 42 through 50 only simulate Vccmin for one SRAM cell. By repeating steps 20 through 36, the distribution of read Vccmin, write Vccmin and Vccmin can be simulated.

Figure 4:
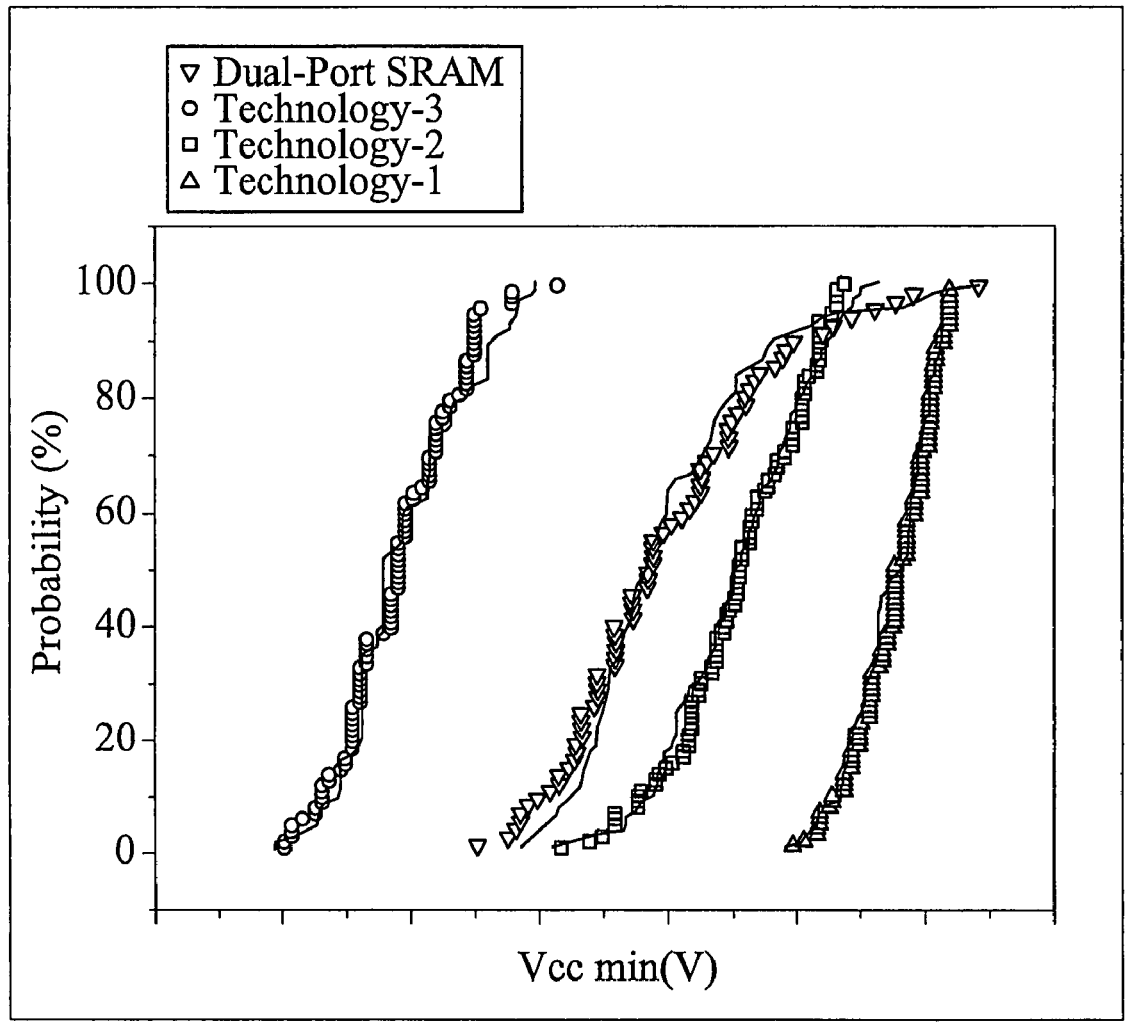
FIG. 4 illustrates distributions of Vccmin of SRAM cells formed using different technologies, wherein experiment data and data simulated using the modeling method of the present invention show close agreement.

FIG. 4 illustrates distributions of pre-stress Vccmins, wherein measured Vccmins (from wafers) and simulated Vccmins are compared. SRAM cells are also made and simulated using several formation technologies (for example, several scales) to verify the consistency of the modeling method of the present invention. Triangles, circles, and squares represent SRAM cells formed using different technologies. Solid lines are simulated Vccmins. It is found that the simulated Vccmin distributions accurately reproduced the experiment distributions of Vccmins.

The process steps discussed in the preceding paragraphs provide a modeling method for determining the distribution of pre-stress performance parameters. If the stress generator (26 in FIGS. 1 and 3) is used to simulate the drifting of performance parameters such as Vt, Idsat, and the like, the post-stress distribution of the target performance parameter can also be simulated. In an exemplary embodiment, the stress generator provides a drift value of the performance parameter, which may be calculated using an empirical equation. In the empirical equation, the drift value is expressed as a function of stress time, temperature, gate length, and the like. It is found that read margin, write margin and Vccmin of an SRAM cell are tightly related to threshold voltages of transistors in the SRAM cell. Therefore, using the drift of threshold voltage Vt as an example, a threshold voltage that will be provided to the simulator equals:

$$Vt = \text{target\_}Vt + \text{delta\_}Vt + \text{delta\_}Vt\_\text{NBTI} \qquad [\text{Eq. 3}]$$

wherein target_Vt is the target threshold voltage of the corresponding transistor, delta_Vt is a variation generated by the performance parameter distribution generator, and delta_Vt_NBTI is the drift in threshold voltage generated by the stress generator. Therefore, in the set of circuit parameters provided to the simulator, the NBTI effect has been taken into account. Accordingly, the simulated target performance parameter and its distribution reflect the behavior of the circuit after NBTI stress.

Figure 5A:
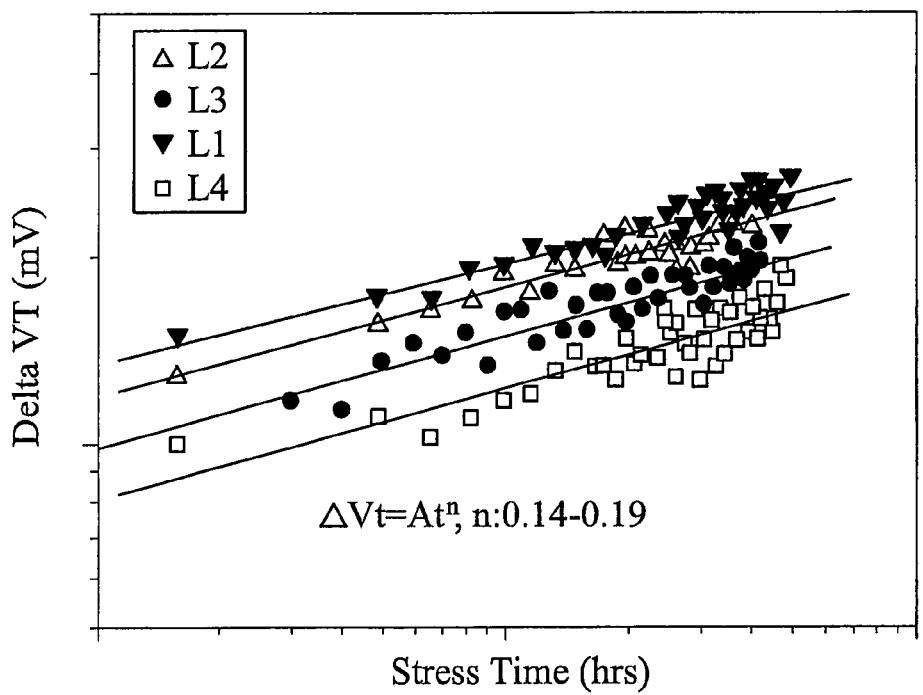
FIG. 5A illustrates an exemplary threshold voltage drift as a function of stress time.
Figure 5B:
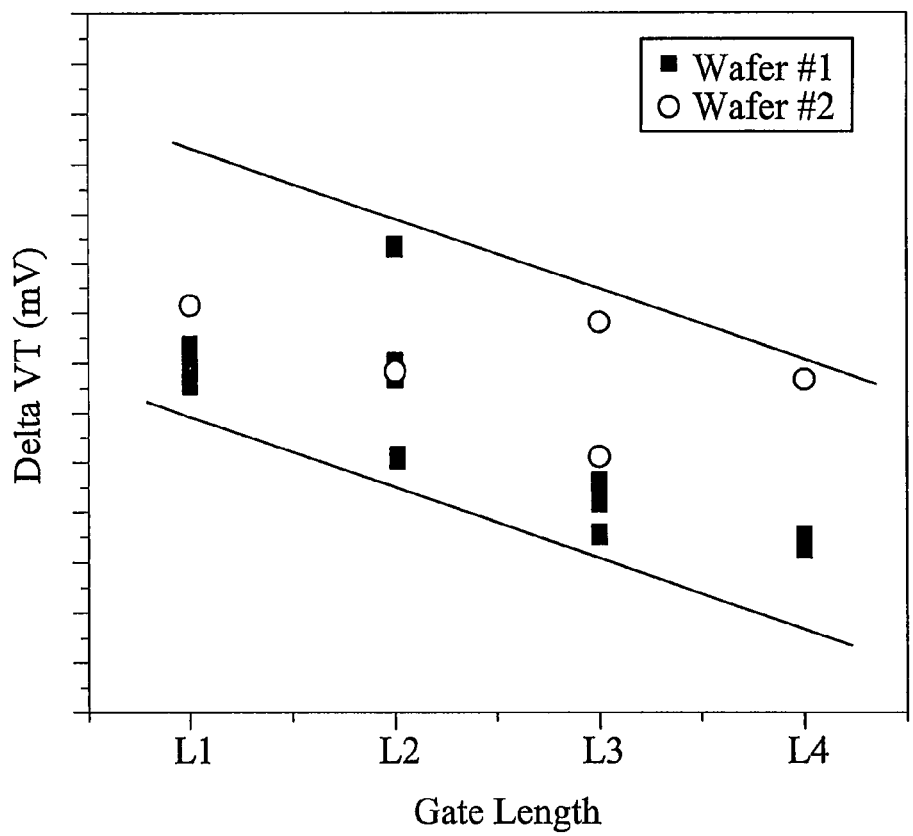
FIG. 5B illustrates an exemplary threshold voltage drift as a function of gate length.

An exemplary embodiment for the stress generator to determine the NBTI effects may be explained using FIGS. 5A and 5B. FIG. 5A illustrates the measured threshold voltage drift (delta Vt) as a function of stress time. Hollow triangles, solid triangles, squares and circles each are data measured from transistors having one gate length. It is noted that for different gate lengths, the corresponding drifts in threshold voltages are different, although they all increase with stress time. Delta Vt can be expressed as $At^n$, wherein t is the stress time, and n is an exponent of the time dependence in the range of, for example, about 0.14 to about 0.19. FIG. 5B illustrates an exemplary distribution of delta Vt after a specific stress time, wherein squares and circles are each measured from one wafer. It also reveals that the gate lengths affect the threshold voltage drifts delta Vt, and the longer the gates are, the smaller the threshold voltage drift. FIGS. 5A and 5B can be combined to determine a distribution of delta Vt at any stress time. When a distribution of delta Vt at a specific time is obtained using FIG. 5B, the distribution of delta_Vt_NBTI (refer to Equation 3) at other stress time may be derived using FIG. 5A.

After obtaining after-stress performance parameters such as Vt in Equation 3, the circuit parameters including process parameters and performance parameters are input into the circuit simulator to obtain a distribution of post-stress target performance parameter. Therefore, both pre-stress and post-stress distributions of the target performance parameter can be predicted. These data can then be used for optimizing design and improving reliability, which will be discussed subsequently. Again, the design of SRAM array is used as an example.

To obtain the distribution of Vccmin, a sample wafer is formed, which includes a plurality of dies. Each die preferably contains an SRAM array, for example, with 8 mega SRAM cells. Each die has an SRAM cell with a highest read Vccmin among the 8 mega SRAM cells. The highest read Vccmin is the dominating read Vccmin of the array, hence is the read Vccmin of the array. The read Vccmin of each die is plotted as solid triangles in FIG. 6A, which illustrates the probability (of Vccmin having a specific value) as a function of voltage. Similarly, each die also has a write Vccmin, which is the highest write Vccmin among all 8 mega SRAM cells. The write Vccmin of each die is plotted as a solid square in FIG. 6A. It is noted that among this wafer, Vccmin is dominated by write Vccmin, since write Vccmins are greater than read Vccmins.

Figure 6A:
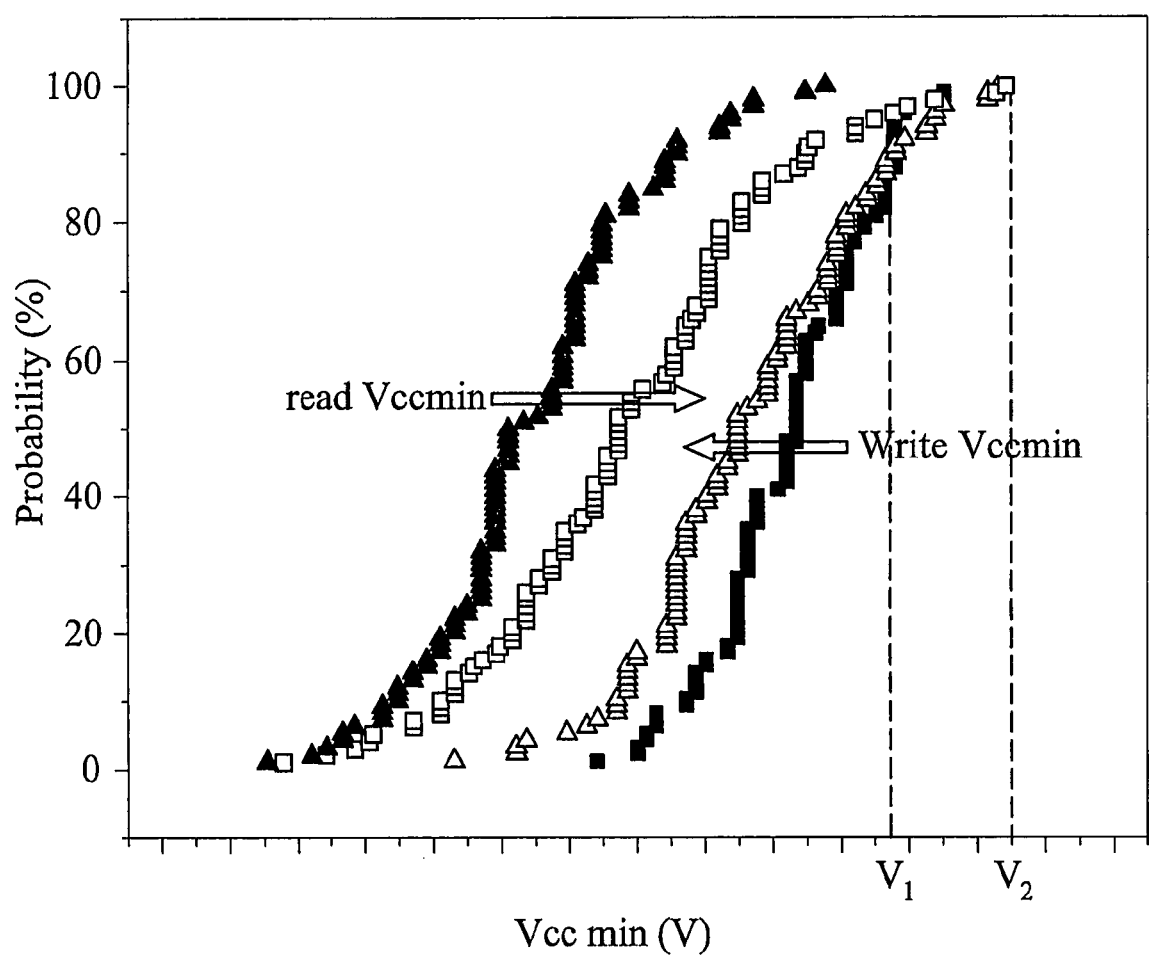
FIG. 6A illustrates the distributions of read margins (RM) and write margins (WM) of SRAM cells on different dies on a wafer, wherein the distributions of pre-stress and after-stress are shown.

For discussion purposes, assuming that the distributions of performance parameters on dies reflect the distributions of a memory array, which is on a same die, and thus the distributions in FIG. 6A are treated as the distributions of read Vccmin, write Vccmin and Vccmin in an SRAM array. The Vccmin of the memory array will thus be V1, which is the worst write Vccmin of all SRAM cells in the SRAM array. The post-stress write Vccmins are plotted as hollow squares. The post-stress read Vccmins are plotted as hollow triangles. It is noted that the post-stress Vccmin is drifted to V2.

Typically, after NBTI stress, write Vccmins of a memory array improve, while read Vccmins degrade. Therefore, for a WM-dominant memory, which means that more SRAM cells have write Vccmins greater than read Vccmins, it is likely that the Vccmin of the memory improves. The reason may be schematically illustrated in FIG. 6B, wherein each line represents a distribution of one of the read and write Vccmins. The NBTI stress causes the read Vccmin distribution to be changed from line 44 to line 46, and the write Vccmin distribution to be changed from line 40 to line 42. It is noted that the post-stress Vccmin V2 is less than the pre-stress Vccmin V1. In this case, the NBTI stress causes no increase in Vccmin of the array. Conversely, for a RM-dominant memory, it is likely that the Vccmin of the memory worsens. The reason may be schematically illustrated in FIG. 6C. It is noted that the Vccmin of the memory is always dominated by read Vccmins, which increase due to NBTI stress. Therefore, WM-dominant memory arrays are preferred over RM-dominant arrays.

Figure 6B:
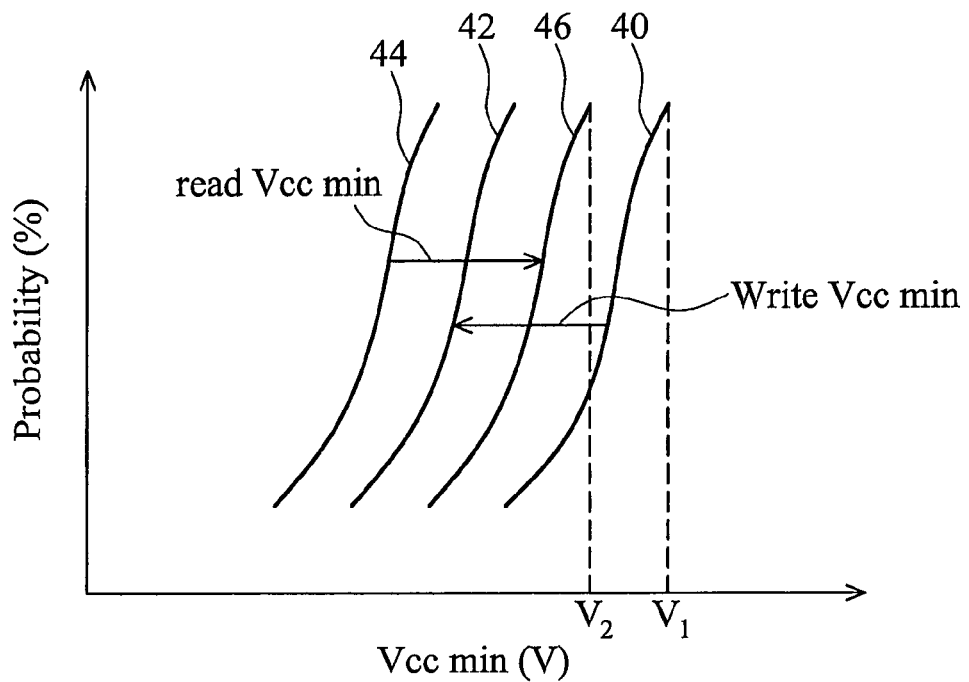
FIG. 6B schematically illustrates the drifts of RMs and WMs, wherein the pre-stress SRAM cells are WM-dominant.
Figure 6C:
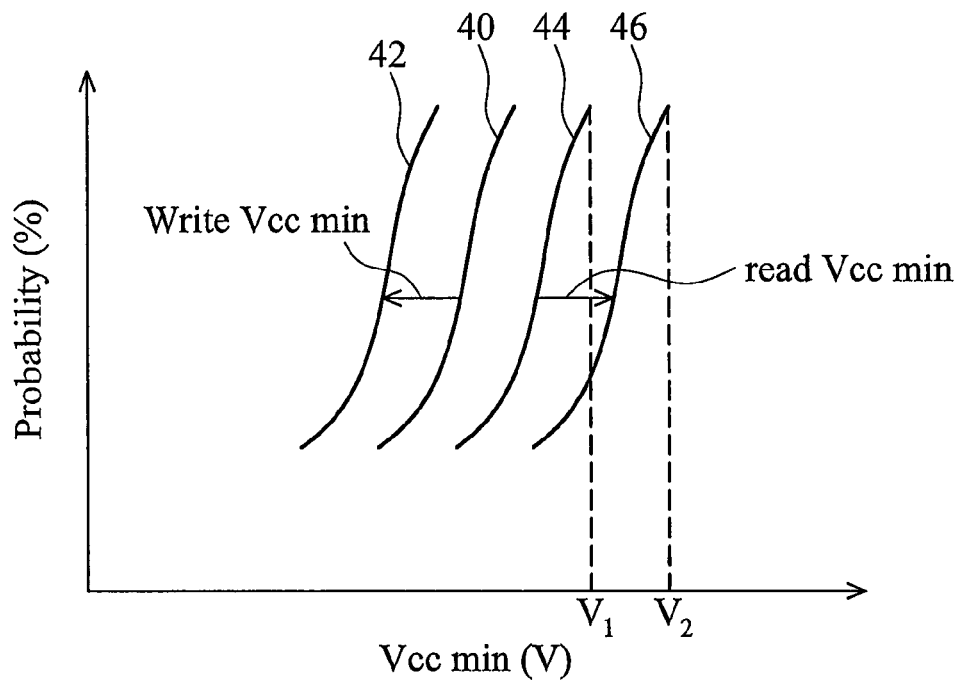
FIG. 6C schematically illustrates the drifts of RMs and WMs, wherein the pre-stress SRAM cells are RM-dominant.

FIG. 6B reveals that by increasing the proportion of WM-dominant cells and providing a sufficiently large difference between the read Vccmin and write Vccmin through design and process optimization, Vccmin drift of the population can be at least controlled to tolerable levels. Thus, while it is impossible to completely avoid the drift of Vccmin in individual SRAM cells, it is possible to eliminate it as a practical reliability concern during circuit operation for SRAM arrays.

Figure 7:
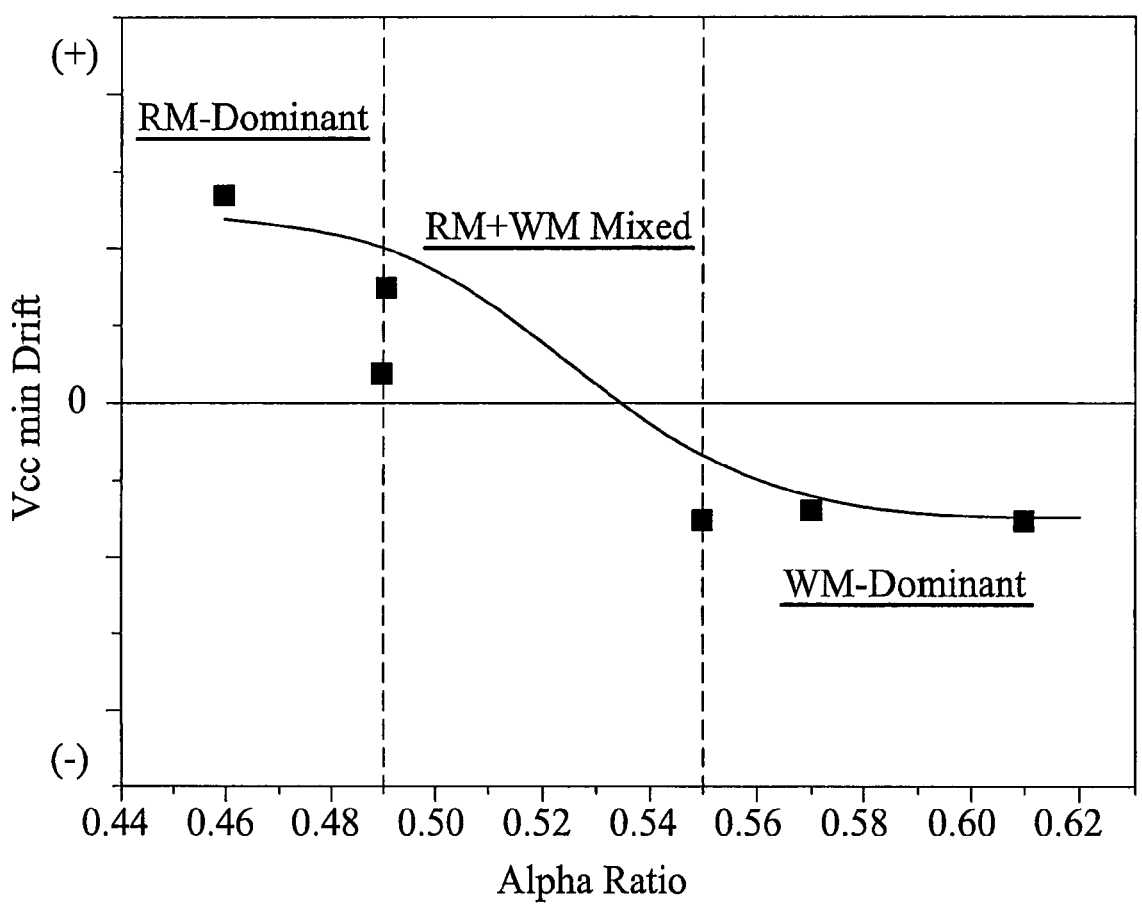
FIG. 7 illustrates the drift of Vccmin as a function of alpha ratio.

One of the methods for increasing proportion of WM-dominant memory cells is to increase a ratios of SRAM cells. FIG. 7 schematically illustrates the drift of Vccmin as a function of $\alpha$ ratio, which is the ratio of the drive current of a pull-up transistor to the drive current of a pass-gate transistor. It has been found that $\alpha$ ratio is a good predictor of whether the SRAM cell is RM-dominant or WM-dominant. As $\alpha$ increases, Vccmin transitions from RM-dominant to WM-dominant, which means that RM decreases and WM increases. Since WM-dominant arrays have smaller Vccmin drift during NBTI stresses, the $\alpha$ ratio may be increased to achieve WM-dominant memory arrays when necessary. Please note that a negative Vccmin drift actually indicates an over-design. A preferable range of $\alpha$ ratio for circuit designers is between about 0.4 and about 0.7.

Figure 8:
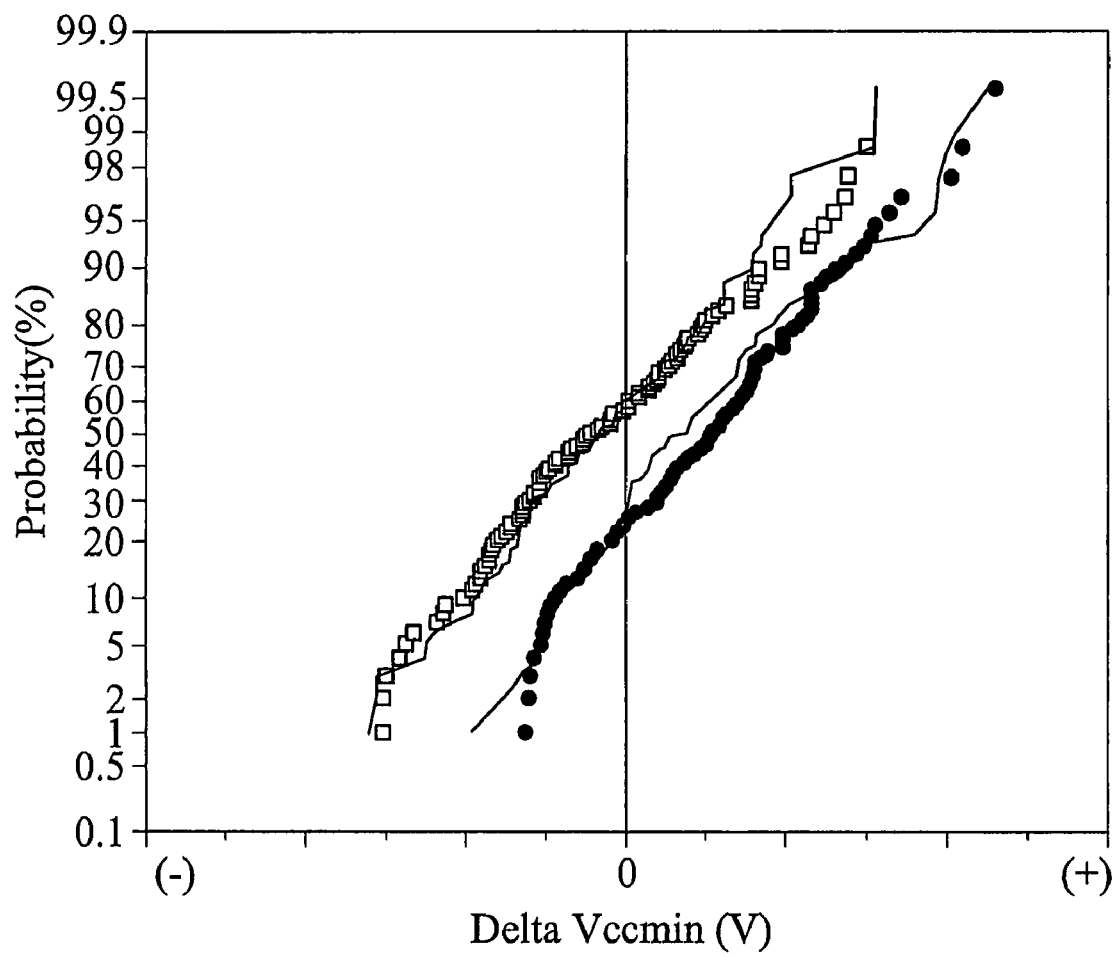
FIG. 8 shows that an increase in alpha ratio results in the lowering of the drift in Vccmin.

In a memory array or a wafer, it is likely there are WM-dominant cells and RM-dominant cells, and these cells will have different Vccmin drifts (delta Vccmin). FIG. 8 illustrates probability as a function of Vccmin drift, wherein solid squares represent the experimental distribution of SRAM cells of a first design. Squares represent the distribution of memory cells of a second design, wherein in the second design, a ratios of memory cells are greater than in the first design. It is noted that by increasing a ratio, Vccmin drift is reduced. Since memory cells with positive delta Vccmin are likely to be RM-dominant, and memory cells with negative delta Vccmin are likely to be WM-dominant, the memory cells in the second design have a higher proportion of WM-dominant SRAM cells. It is obvious that if the initial (pre-stress) proportion of RM-dominant SRAM cells is high, Vccmin degradation due to NBTI stress is more significant. Moreover, the ratio of the number of RM-dominant devices to WM-dominant devices increases after stress since degraded RM-dominant cells progressively dominate the Vccmin distribution.

In FIG. 8, the distribution of delta Vccmin (solid lines) are also simulated using the modeling method of the present invention. The simulated distributions are in close agreement with the measured distributions, confirming that the modeling system and the modeling methods of the present invention are capable of accurately predicting the post-stress behavior of integrated circuits.

Referring back to FIG. 6A again, with the ability provided by the modeling technique of the present invention, the pre-stress and post-stress distributions of read Vccmin and write Vccmin distributions can be determined. Therefore, by modifying design (such as change a ratio), it is possible to significantly reduce, and possibly, substantially eliminate Vccmin drift. A significant advantageous feature of the present invention is that being able to determine the distribution of target performance parameters (such as read Vccmin, write Vccmin and Vccmin) substantially accurately, designers do not have to over-design the circuits. For example, designers no longer need to design circuits with $\alpha$ ratios higher than necessary.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of modeling integrated circuits, the method comprising:
    generating a set of circuit parameters of a circuit using a random mean, wherein the set of circuit parameters reflects a statistic distribution of measured circuit parameters after a negative-bias thermal instability (NBTI) stress is performed on the circuit, with the set of circuit parameters being a function of a stress time and a function of a stress temperature; and
    generating a target performance parameter of the circuit by assigning the set of circuit parameters into a circuit simulator.

2. The method of claim 1 further comprising repeating the steps of generating the set of circuit parameters and generating the target performance parameter, wherein each of the set of circuit parameters are randomly generated by the random mean.

3. The method of claim 1, wherein the random mean is a stochastic technique.

4. The method of claim 1, wherein the step of the generating the set of circuit parameters is performed by generators comprising a process variation generator.

5. The method of claim 1, wherein the set of circuit parameters is a function of a gate length of a MOS device in the circuit.

6. The method of claim 1, wherein the circuit comprises a static random access memory (SRAM) cell, and wherein the target performance parameter is selected from the group consisting essentially of read Vccmin, write Vccmin, Vccmin, and combinations thereof.

7. The method of claim 1, wherein the step of generating the set of circuit parameters is performed by generators comprising a performance parameter distribution generator generating data reflecting a statistic distribution of a performance parameter.

8. A modeling system for modeling integrated circuits, the modeling system comprising:
    a process variation generator for generating a first statistic distribution reflecting measured data of a process parameter of a circuit;
    a performance parameter distribution generator for generating a second statistic distribution reflecting measured data of a performance parameter of the circuit;
    a stress generator for generating a third statistic distribution reflecting measured data of the performance parameter of the circuit under a stress condition, wherein the stress generator is configured to generate the third statistic distribution as a function of a stress time and a function of a stress temperature of the stress condition; and a circuit simulator for receiving data randomly generated based on the first, the second and the third statistic distributions and for generating a statistic distribution of a target performance parameter of the circuit.

9. The modeling system of claim 8, wherein the process variation generator is configured to generate the first statistic distribution of the process parameter using a stochastic technique.

10. The modeling system of claim 8, wherein the first statistic distribution of the process parameter reflects a distribution of measured process data from a wafer comprising the circuit.

11. The modeling system of claim 8, wherein the third statistic distribution is related to a gate dimension of a transistor in the circuit.

12. The modeling system of claim 11, wherein the circuit comprising a SRAM cell-comprising circuit, and wherein the target performance parameter is selected from a group consisting essentially of read Vccmin, write Vccmin, Vccmin, and combinations thereof, of the SRAM cell-comprising circuit.

13. The modeling system of claim 8, wherein each of the second and the third statistic distributions reflects a distribution of measured data of the performance parameter from a wafer comprising the circuit.

14. A method of modeling integrated circuits, the method comprising:
providing a circuit simulator;
providing a process variation generator generating a first statistic distribution reflecting measured data of process parameters of an SRAM cell-comprising circuit by a stochastic technique;
providing a performance parameter distribution generator generating a second statistic distribution reflecting measured data of a performance parameter of the SRAM cell-comprising circuit by the stochastic technique;
generating a pre-stress distribution of the performance parameter of the SRAM cell-comprising circuit using the first and the second statistic distributions, wherein the performance parameter comprises read Vccmins and write Vccmins of the SRAM cell-comprising circuit; and
generating a post-stress distribution of the read Vccmins and the write Vccmins of the SRAM cell-comprising circuit using the first, the second, and the pre-stress distributions, wherein the post-stress distribution is generated as a function of a stress time and a stress temperature of a stress condition of the SRAM cell-comprising circuit.

15. The method of claim 14 further comprising forming the SRAM cell-comprising circuit according to the post-stress distribution, wherein the write Vccmins of SRAM cells in the SRAM cell-comprising circuit are greater than the read Vccmins of SRAM cells.

16. The method of claim 14, wherein before the stress condition, the SRAM cell-comprising circuit has a first Vccmin, and after the stress condition, the SRAM cell-comprising circuit has a second Vccmin, and wherein the second Vccmin is less than the first Vccmin.

17. The method of claim 14, wherein the steps of generating the second, the pre-stress, and the post-stress distributions comprise measuring read Vccmins and write Vccmins from dies on a wafer.

18. The method of claim 14 further comprising:
comparing the pre-stress and the post-stress distributions; and
adjusting alpha ratios of SRAM cells in the SRAM cell-comprising circuit using the pre-stress distribution and the post-stress distribution to reduce Vccmin drift caused by the stress condition.

19. The method of claim 14, wherein post-stress distribution is generated as a function of a gate dimension of a MOS device in the SRAM cell-comprising circuit.

* * * * *